(12) United States Patent
Feng et al.

(10) Patent No.: US 11,621,368 B2
(45) Date of Patent: Apr. 4, 2023

(54) MAGNETIC LIGHT-EMITTING STRUCTURE AND FABRICATION METHOD FOR MANUFACTURING A MAGNETIC LIGHT-EMITTING ELEMENT

(71) Applicant: INGENTEC CORPORATION, Miaoli County (TW)

(72) Inventors: Hsiang-An Feng, Miaoli County (TW); Chia-Wei Tu, Miaoli County (TW); Cheng-Yu Chung, Miaoli County (TW); Ya-Li Chen, Miaoli County (TW)

(73) Assignee: Ingentec Corporation, Miaoli County (TW)

( * ) Notice: Subject to any disclaimer, the term of this patent is extended or adjusted under 35 U.S.C. 154(b) by 297 days.

(21) Appl. No.: 17/022,511

(22) Filed: Sep. 16, 2020

(65) Prior Publication Data
US 2022/0045237 A1   Feb. 10, 2022

(30) Foreign Application Priority Data
Aug. 5, 2020 (TW) ................................. 109126508

(51) Int. Cl.
  *H01L 33/00* (2010.01)
  *H01F 1/147* (2006.01)
  *H01L 25/075* (2006.01)

(52) U.S. Cl.
  CPC ..... *H01L 33/0095* (2013.01); *H01F 1/14708* (2013.01); *H01L 25/0753* (2013.01)

(58) Field of Classification Search
  None
  See application file for complete search history.

(56) References Cited

U.S. PATENT DOCUMENTS 10,944,024 B1*  3/2021  Horng .................... H01L 33/40
2016/0268491 A1*  9/2016  Wu ........................ H01L 24/75

FOREIGN PATENT DOCUMENTS

TW        M588865 U       1/2020

OTHER PUBLICATIONS

International Search Report Issued by a Foreign Patent Office in No. 109126508.

* cited by examiner

*Primary Examiner* — Bradley Smith
(74) *Attorney, Agent, or Firm* — Rosenberg, Klein & Lee

(57) ABSTRACT

A magnetic light-emitting structure and fabrication method for manufacturing a magnetic light-emitting element are provided. The fabrication method comprises providing a magnetic metal composite substrate, wherein a second metal layer is respectively disposed on an upper and lower surface of a first metal layer; forming a connecting metal layer, an epitaxial layer and a plurality of electrode unit on top; and performing a complex process, which removes the second metal layer on the lower surface of the first metal layer and part of the first metal layer and performs cutting according to the number of the electrode unit, so as to form a plurality of epitaxial die. Each epitaxial die corresponds to an electrode unit to form a magnetic light-emitting element. The proposed method improves soft magnetic properties of an original substrate and enables dies to reverse spontaneously, thereby used perfectly for industrial mass transfer technology.

17 Claims, 15 Drawing Sheets

MAGNETIC LIGHT-EMITTING STRUCTURE AND FABRICATION METHOD FOR MANUFACTURING A MAGNETIC LIGHT-EMITTING ELEMENT

This application claims priority for Taiwan patent application no. 109126508 filed on 5 Aug. 2020, the content of which is incorporated by reference in its entirely.

BACKGROUND OF THE INVENTION

Field of the Invention

The present invention relates to a magnetic light-emitting structure and a fabrication method for manufacturing a magnetic light-emitting element. More particularly, the magnetic light-emitting structure and fabrication method for manufacturing the magnetic light-emitting element of the present invention are aimed to modify a magnetic metal composite substrate to comprising a vertical type light emitting diode die of better soft magnetic properties and initial magnetic permeability.

Description of the Prior Art

In general, a Light Emitting diode (LED) is a kind of light source which is fabricated using the semiconductor technology and formed by III-V group compound semiconductors. The LEDs operate based on a fact that electrons are combined with holes in a semiconductor to produce photons. The LEDs are different from the conventional light bulbs working at a high temperature of thousands of degrees. The LEDs are also different from fluorescent lamps using a high voltage to excite an electron beam. Just like a general electronic element, an LED only requires a voltage of 2~4 V to operate and thus being able to work at a normal temperature environment. Compared with the traditional tungsten light bulbs, LEDs are certainly advantageous of having longer lifetime, higher luminous efficiency, lower failure rate, saving more power, and giving much more stable light. Also, LEDs are highly compatible with various types of lamp devices. Therefore, the luminous life of LEDs is believed to be much longer than that of the traditional light sources, thereby the LEDs has successfully become a mainstream commodity in the market nowadays.

Overall, the LED structures mainly comprise a horizontal structure and a vertical structure. Regarding a horizontal-structure LED, two electrodes of the horizontal-structure LED are arranged at the same side of the LED chip. Nevertheless, two electrodes of a vertical-structure LED are respectively arranged at two opposite sides of an epitaxial layer of the LED chip. In general, compared with the horizontal-structure LED, the vertical-structure LED has advantages of high brightness, rapid heat dissipation rate, small luminous decay and high stability. In view of device structure, photoelectric parameter, thermal property, luminous decay and fabrication cost, the vertical-structure LED always has much better heat dissipation effect than the horizontal-structure LED. Due to the great heat dissipation feature of the vertical-structure LED, the heat generated by the chip can always be dissipated in time, thereby minimizing the attenuation in performance of the chip and phosphor. As a result, it is believed that the LEDs are successfully characterized by high brightness, rapid heat dissipation rate, small luminous decay, and less drift of light color and thus provides much more reliable stability.

However, it is known that LEDs have been widely applied in a variety of technical fields recently. For example, LEDs can be applied into a smart phone. And once the smart phone starts to overheat, the LED chip installed therein will also be affected. And then, the substrate used to place the dies in the LED chip and to connect the smart phone or other devices will be affected as well. If such substrate has poor thermal expansion coefficient, the substrate is very likely to bend and deform due to the temperature changes, thereby influencing the lighting efficiency of the LED chip.

On the other hand, Micro LEDs are also regarded as an emerging technology after the miniaturization and matrixization of LEDs, which can integrate high-density and small-sized LED arrays on the wafer. Each pixel therein can be addressed and individually driven to emit light. However, despite the continuous progress of Micro LEDs, the manufacturing cost of Micro LEDs, so far has remained very high, and thus affects its commercialization process. The main problem is that, the micro-assembly of "Mass Transfer" technology are not accomplished. In the prior arts, a manipulator to repeatedly reciprocate and grip individual Micro LED chip one at one time is the only way to transfer the Micro LED chip onto the substrate. Such traditional operating method takes too much cost and time, which results in one of the major bottlenecks of the current Micro LED to achieve mass transfer and causes enormously high production cost as well as excessive man-operating hours.

Besides, in the traditional method to proceed with the mass transfer of Micro LEDs, a flip-chip technology usually must be involved for reversing (flip-chipping) the die due to the few connection points (electrical pads) thereof. And such action also plays a complicated and redundant role in the process of the mass transfer of Micro LEDs and is therefore a serious issue to be overcome as well.

Therefore, on account of above, to overcome the above-mentioned problems, it should be obvious that there is indeed an urgent need for the professionals in the field for a new magnetic light-emitting structure and a fabrication method for manufacturing a magnetic light-emitting element to be developed that can effectively solve the above mentioned problems occurring in the prior design. By using the proposed fabrication method, a composite substrate having low production cost, better soft magnetic properties, initial magnetic permeability, a high thermal conductivity and low thermal expansion coefficient is fabricated. Hereinafter, the detailed specific implementations will be fully described in the following paragraphs.

SUMMARY OF THE INVENTION

In order to overcome the above mentioned disadvantages, one major objective in accordance with the present invention is provided for a magnetic light-emitting structure and a fabrication method for manufacturing a magnetic light-emitting element. The novel magnetic light-emitting element comprises a vertical type light emitting diode die of great initial magnetic permeability, which is composed of a substrate having soft magnetic properties and an epitaxial electrode layer formed on the magnetic substrate. Owing to the extraordinary soft magnetic properties and initial magnetic permeability characterized by the magnetic substrate disclosed by the present invention, the present invention is thus applicable to meeting the requirements for industrial mass transfer technological needs.

And yet, another major objective in accordance with the present invention is provided for a spontaneous automatic reversal effect due to a certain magnetic force difference between the upper layer (i.e. the epitaxial layer) and the lower layer (i.e. the nickel-iron alloy layer) of the magnetic light-emitting element. Such a magnetic force difference enables each final crystal die to be able to perform automatic reversal even when it was in a wrong direction in the first place. In this case, the nickel-iron alloy layer can always automatically turn down and in a lower position of the structure, such that the optimal result of automatic alignment and positioning can be accomplished. Through the spontaneous automatic reversal effect of each die along with the subsequent Micro LED mass transfer process, the present invention achieves to avoid the conventional flip-chip process and operation steps thereof. As a result, the traditional excessively high operating time, manpower, and production cost are effectively reduced, perfectly meeting the requirements for industrial mass transfer technological needs nowadays.

For achieving the above mentioned objectives, the technical solutions of the present invention are aimed to provide a fabrication method for manufacturing a magnetic light-emitting element, comprising: providing a magnetic metal composite substrate, which comprises a first metal layer and two second metal layers, wherein each of the second metal layers is respectively disposed on an upper surface and a lower surface of the first metal layer; then forming a connecting metal layer on the magnetic metal composite substrate and an epitaxial layer on the connecting metal layer; next, providing a plurality of electrode unit on a top surface of the epitaxial layer; and performing a complex process, which comprises removing the second metal layer which is located on the lower surface of the first metal layer and part of the first metal layer as well as performing cutting according to the number of the plurality of electrode unit, so as to form a plurality of epitaxial die. Each the epitaxial die corresponds to each the electrode unit to form one magnetic light-emitting element according to each the epitaxial die.

An another aspect of the present invention is to show that the magnetic light-emitting element fabricated by the present invention can be further adhesively connected to an adhesive material layer through the epitaxial layer to maintain the integrity of the die and protect it from being damaged. Furthermore, using the adhesive material layer also helps to improve the subsequent cutting quality of the die and the convenience of grabbing the die. In one embodiment of the present invention, the proposed adhesive material layer can be, for instance a blue tape or a UV tape.

In addition, according to one embodiment of the present invention, a material of the first metal layer in the magnetic metal composite substrate, for example, can be nickel-iron alloy (Invar). And, a material of the second metal layer in the magnetic metal composite substrate is copper. A thickness proportion of the second metal layer to the first metal layer to the second metal layer in the magnetic metal composite substrate ranges from 1:3:1 to 1:9:1. The second metal layer, the first metal layer and the second metal layer therein the magnetic metal composite substrate can be combined through cutting, vacuum heating, and grinding or polishing to form the magnetic metal composite substrate, such that the magnetic metal composite substrate has a high thermal conductivity, low thermal expansion coefficient and initial magnetic permeability. As one illustrative example, according to the embodiment of the present invention, the magnetic metal composite substrate formed by the present invention may have a thickness of 30 microns to 50 microns.

Furthermore, according to the complex process disclosed in one embodiment of the present invention, the complex process may comprise the following steps:

1. performing a cutting process, in which the cutting process performs dividing according to the number of the plurality of electrode unit. The cutting process is applied to the epitaxial layer, the connecting metal layer and the magnetic metal composite substrate to form the plurality of epitaxial die, such that each the epitaxial die corresponds to each the electrode unit. The cutting process includes a cutting end point, and the cutting end point is configured in the first metal layer of the magnetic metal composite substrate; and 2. performing an etching process, which removes the second metal layer which is located on the lower surface of the first metal layer and part of the first metal layer, such that the magnetic light-emitting element is formed according to each the epitaxial die.

Alternatively, according to the complex process disclosed in another embodiment of the present invention, the complex process may comprise the following steps:

1. performing an etching process, which removes the second metal layer which is located on the lower surface of the first metal layer and part of the first metal layer; and 2. performing a cutting process, in which the cutting process performs dividing according to the number of the plurality of electrode unit. The cutting process is applied to the epitaxial layer, the connecting metal layer, the second metal layer which is located on the upper surface of the first metal layer and the remaining first metal layer to form the plurality of epitaxial die, such that each the epitaxial die corresponds to each the electrode unit, and the magnetic light-emitting element is formed according to each the epitaxial die.

Among the foregoing two various embodiments disclosed by the present invention, the proposed cutting process can be implemented through a laser cutting, having its laser wavelength in a range of 355 nm to 532 nm. A cutting depth is made to be 30 microns to 50 microns.

Also, according to the two embodiments disclosed by the present invention, the proposed etching process can be implemented through a wet chemical etching process, in which an etching time for the wet chemical etching process is 10 minutes, and an etching solution is alternatively a ferric chloride solution, a mixture of nitric acid ($HNO_3$) and hydrogen peroxide ($H_2O_2$), or a mixture of sulfuric acid ($H_2SO_4$) and hydrogen peroxide ($H_2O_2$), wherein the ratio of nitric acid to hydrogen peroxide for example, can be 3:1, and the ratio of sulfuric acid to hydrogen peroxide can be 4:1.

In yet another aspect, the present invention further provides a magnetic light-emitting structure, comprising: a magnetic metal composite substrate; a connecting metal layer, being disposed on the magnetic metal composite substrate; an epitaxial layer, being disposed on the connecting metal layer; a plurality of electrode unit, being disposed on a top surface of the epitaxial layer; a titanium layer, being disposed on a lower surface of the magnetic metal composite substrate; and a gold layer, being disposed on a lower surface of the titanium layer. In the embodiment, the disclosed magnetic metal composite substrate includes a first metal layer and a second metal layer which is disposed on an upper surface of the first metal layer.

According to such an embodiment, a material of the first metal layer in the magnetic metal composite substrate, for example, can be nickel-iron alloy (Invar). And, a material of the second metal layer in the magnetic metal composite substrate is copper.

Moreover, according to such an embodiment, a thickness of the titanium layer, for example, can be 0.5 μm. A thickness of the gold layer can be 1.0 μm.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
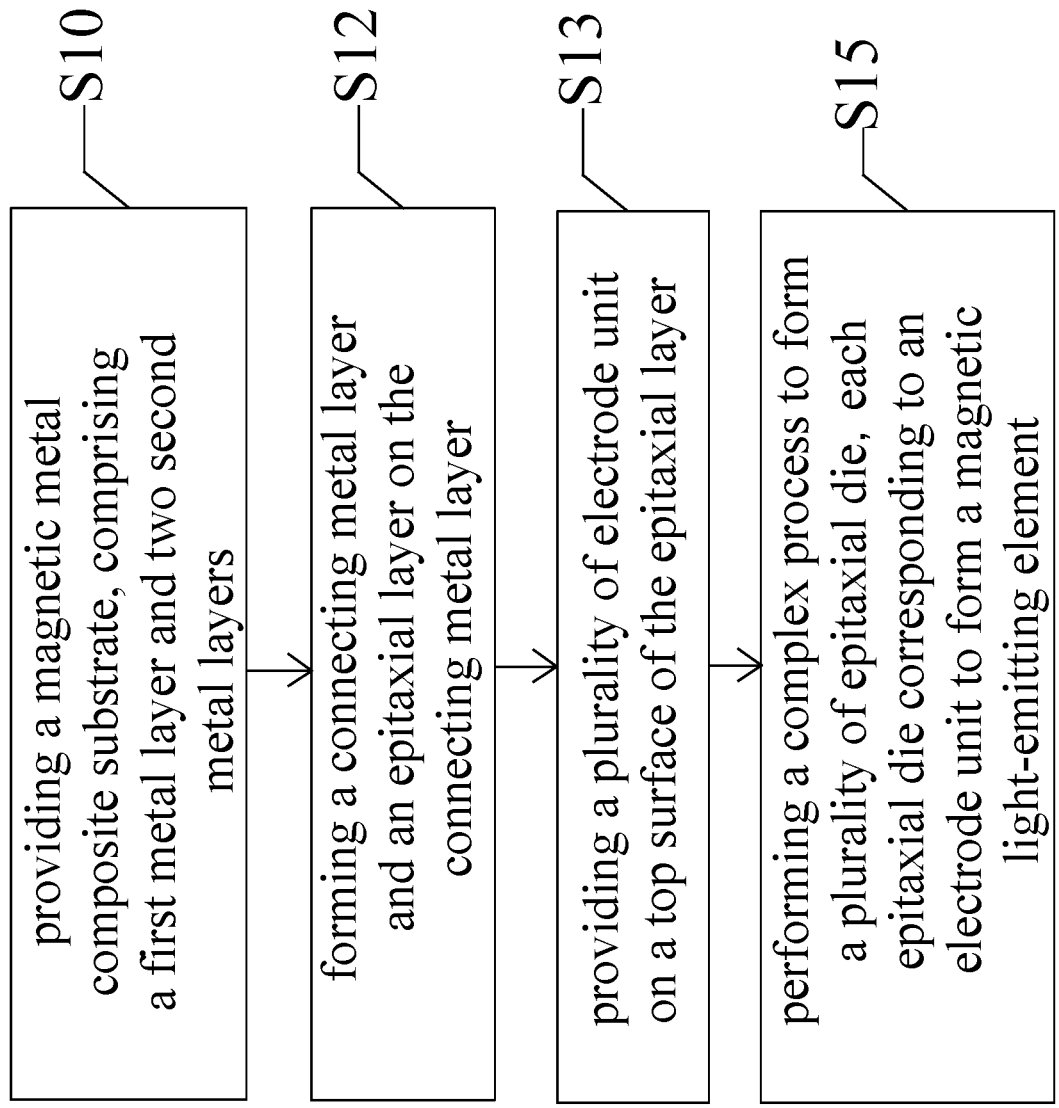
FIG. 1 shows a flow chart of a fabrication method for manufacturing a magnetic light-emitting element in accordance with an embodiment of the present invention.
Figure 2:
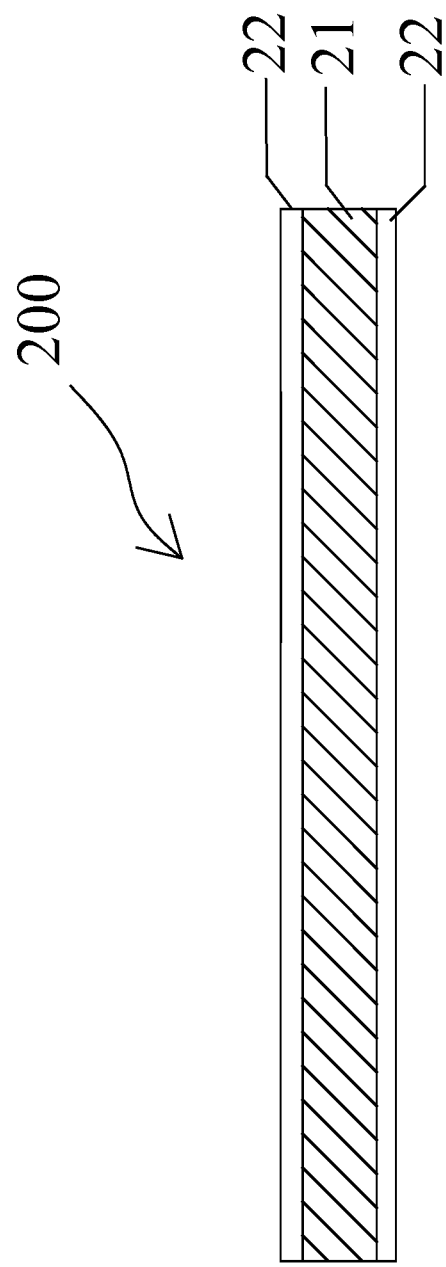
FIG. 2 shows a structural diagram of a magnetic metal composite substrate in accordance with the embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In view of the various deficiencies disclosed by the above mentioned prior arts, the present invention is aimed to provide a fabrication method for manufacturing a magnetic light-emitting element. By fabricating the vertical type light emitting diode die on a substrate having initial magnetic permeability and better soft magnetic properties, the present invention is able to employ the specially designed substrate with soft magnetic properties and the mechanism of magnetic array absorption to comply with the requirements of Micro LED for rapid mass transfer, whereby effectively solves the drawbacks of conventional Micro LED whose manufacturing cost and process are enormously high and complicated.

In addition, due to the magnetic force difference between the upper and lower layers of the substrate, the present invention is aimed to ensure that each final crystal die is able to perform automatic reversal even when it was in a wrong direction in the first place. Therefore, the alignment of the die distribution position is controlled to be accurate. By using such design manners, the present invention effectively solves the conventional problems of excessively high operating time, manpower, and production cost that had been existing in the traditional flip-chip bonding process in the past.

First, please refer to FIG. 1. FIG. 1 shows a flow chart of a fabrication method for manufacturing a magnetic light-emitting element in accordance with an embodiment of the present invention, in which the fabrication method disclosed in the present invention comprises the steps of S10, S12, S13 and S15. In the following paragraphs, the detailed descriptions of the disclosed fabrication method of the present invention will be fully provided, and referred accompanying with the structure and component symbols as shown in FIG. 2 to FIG. 14.

Please refer to S10. In step S10 of the present invention, a magnetic metal composite substrate 200 is provided in the beginning. The magnetic metal composite substrate 200 comprises a first metal layer 21 and two second metal layers 22. Each of the second metal layers 22 is respectively disposed on an upper surface and a lower surface of the first metal layer 21 (shown in FIG. 2). According to the embodiment of the present invention, the material of the first metal layer 21 is a nickel-iron alloy, and the alloy may be, for example, a nickel-iron alloy having a nickel content of 36%. The material of the second metal layer 22 is copper. A thickness ratio of the first metal layer 21 to the second metal layer 22 is 3~9:1, so the magnetic metal composite substrate 200 is formed, comprising the second metal layer 22, the first metal layer 21 and the second metal layer 22 from bottom to top and the thickness proportion of the second metal layer 22 to the first metal layer 21 to the second metal layer 22 ranges from 1:3:1 to 1:9:1. Preferably, the thickness proportion of the second metal layer 22 to the first metal layer 21 to the second metal layer 22 can be 1:5:1. According to the embodiment of the present invention, it is explanatory to illustrate the first metal layer 21 and the second metal layer 22 as a nickel-iron alloy layer and a copper layer, respectively. For example, the thickness of the first metal layer 21 (nickel-iron alloy layer) may preferably be 50 micrometers (μm), and the thickness of the second metal layer 22 (copper layer) may preferably be 10 micrometers (μm). However, the present invention is certainly not limited thereto such dimensions and sizes.

Since the first metal layer 21 and the second metal layer 22 disclosed by the present invention can be combined through cutting, vacuum heating, and grinding or polishing to form the magnetic metal composite substrate 200, the formed magnetic metal composite substrate 200 is able to be characterized by not only a superior initial magnetic permeability, but also a high thermal conductivity and low thermal expansion coefficient. Accordingly, in the subsequent wire bonding and packaging process, it helps to provide better production yield. And compared to the other conventional metal substrates, the production cost of such magnetic metal composite substrate 200 can be much lower, and the thickness is thinner as well. As a result, it indeed offers as a new type of substrate having extremely low thermal expansion coefficient, high thermal conductivity, low production cost, and high yield without the need of any additional thinning process. In addition, such novel magnetic metal composite substrate is also easy to be bonded with an epitaxial layer.

Next, as shown in step S12. A connecting metal layer 202 is disposed on the magnetic metal composite substrate 200, and an epitaxial layer 204 is further disposed on the connecting metal layer 202 (shown in FIG. 3). According to the embodiment of the present invention, the connecting metal layer 202 may further include a contact layer, a reflection layer, and a current distribution layer (not shown). The contact layer is disposed on the magnetic metal composite substrate 200, the reflection layer is disposed on the contact layer, and the current distribution layer is disposed on the reflection layer. Finally, the epitaxial layer 204 is provided on the current distribution layer. According to the embodiment, the contact layer, for example, can be a P-type contact, the reflection layer, for example, can be, a Reflector, and the current distribution layer can be a P-type GaP layer.

Similarly, the epitaxial layer 204 may further include a first Aluminum Gallium Indium Phosphide (AlGaInP) layer, a Multiple quantum wells (MQWs) layer, a second Aluminum Gallium Indium Phosphide (AlGaInP) layer, a Gallium arsenide (GaAs) layer and so on (not shown). For instance, in one embodiment of the present invention, the first AlGaInP layer can be a P-type AlGaInP layer, the second AlGaInP layer can be an N-type AlGaInP layer, and the GaAs layer can be an N-type GaAs layer.

Figure 3:
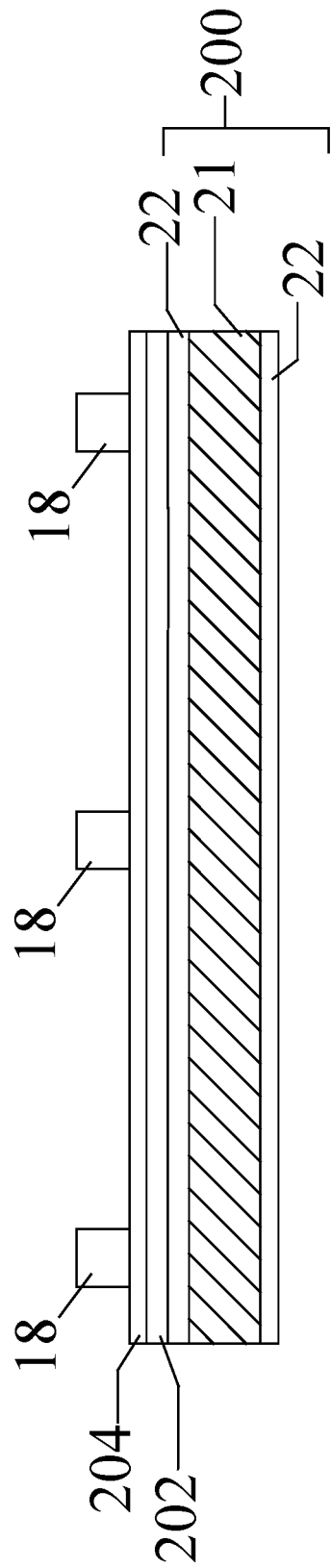
FIG. 3 shows a structural diagram of forming a connecting metal layer, an epitaxial layer and a plurality of electrode unit on top of the magnetic metal composite substrate in accordance with the embodiment of the present invention.

Later, as shown in step S13 and FIG. 3 of the present invention, after the connecting metal layer 202 and the epitaxial layer 204 are provided, a plurality of electrode unit 18 are disposed on a top surface of the epitaxial layer 204 by an annealing process. The alloy of Au and Ge is mixed with Au by the annealing process at a temperature of 360 degrees to form the electrode units 18, wherein the ratio of the alloy of Au and Ge to Au is 2:3 in amount. It is worth noticing that the cross-sectional schematic diagram shown in FIG. 3 merely shows two electrode units 18 for an explanatory embodiment of the present invention. However, the present invention is not limited thereto. According to the present invention, the number of the electrode units 18 can be configured according to various specification requirements, for example, can be plural as well.

Next, as shown in step S15. A complex process is performed, in which the complex process comprises removing the first, second metal layers of the magnetic metal composite substrate 200 and performing cutting according to the number of the electrode unit 18, so as to form a plurality of epitaxial die. Each epitaxial die corresponds to an electrode unit 18 to form a magnetic light-emitting element.

According to the present invention, it is worth noticing that in step S15 of the invention, it is practicable to (1) removing the second metal layer 22 and part of the first metal layer 21 of the magnetic metal composite substrate 200 first, and (2) performing cutting according to the number of the electrode unit 18.

Optionally, in step S15 of the invention, it is also practicable to (1) performing cutting according to the number of the electrode unit 18 first, and (2) removing the second metal layer 22 and part of the first metal layer 21 of the magnetic metal composite substrate 200.

Hereinafter, the present invention is providing various embodiments for these two implementation models, which will be described in detail as follows.

Figure 4:
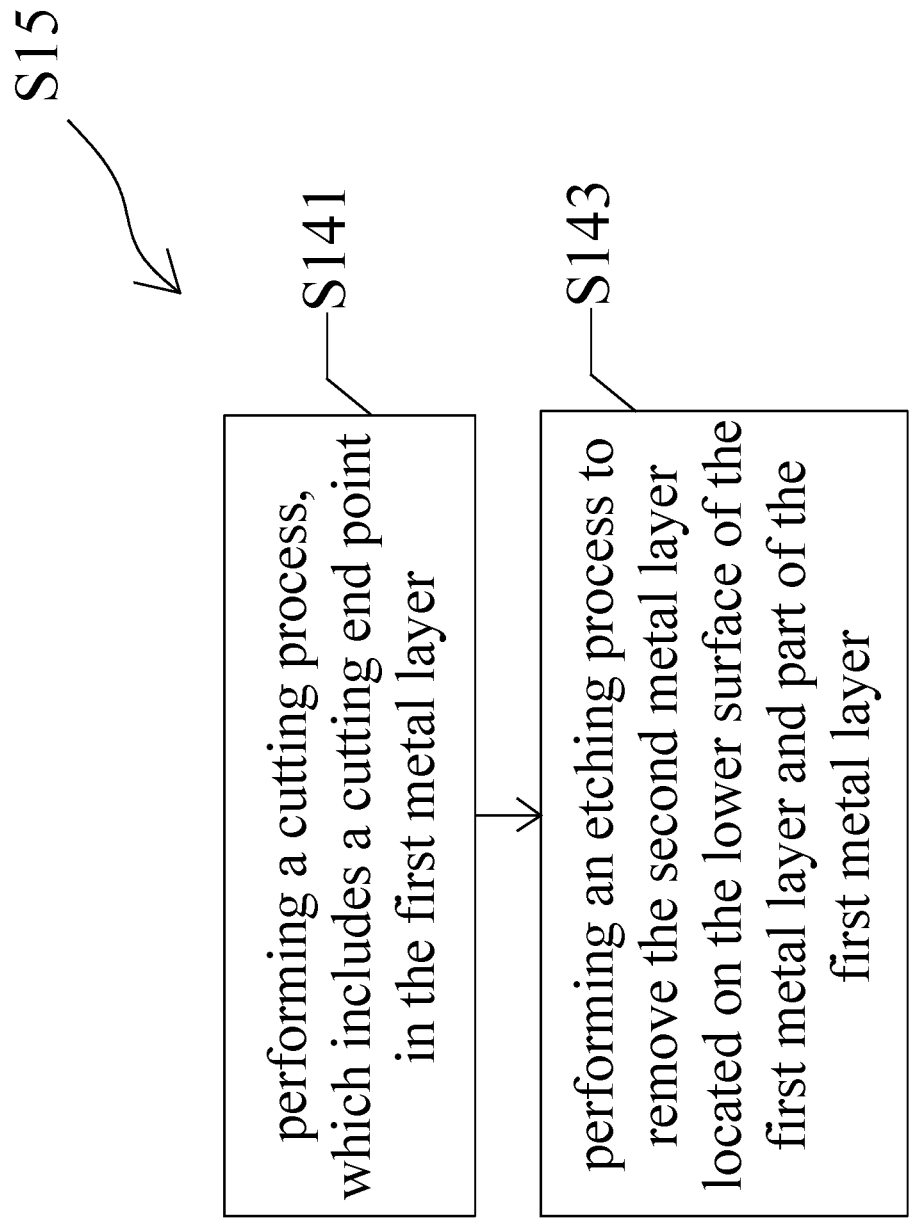
FIG. 4 shows a flow chart of performing the step S15 according to one embodiment of the present invention.

At first, please refer to FIG. 4, which shows a flow chart of performing the step S15 according to one embodiment of the present invention. As illustrated, the step S15 may comprise performing (1) the step S141, and then (2) the step S143. The step S141 comprises performing a cutting process, and the cutting process includes a cutting end point. Please refer to the device structure in FIG. 3 at the same time. The cutting end point is configured in the first metal layer 21 of the magnetic metal composite substrate 200. Afterwards, the step S143 is performed, which comprises performing an etching process, so as to remove the second metal layer 22, which is located on the lower surface of the first metal layer 21, and part of the first metal layer 21 to form the magnetic light-emitting element.

Figure 5:
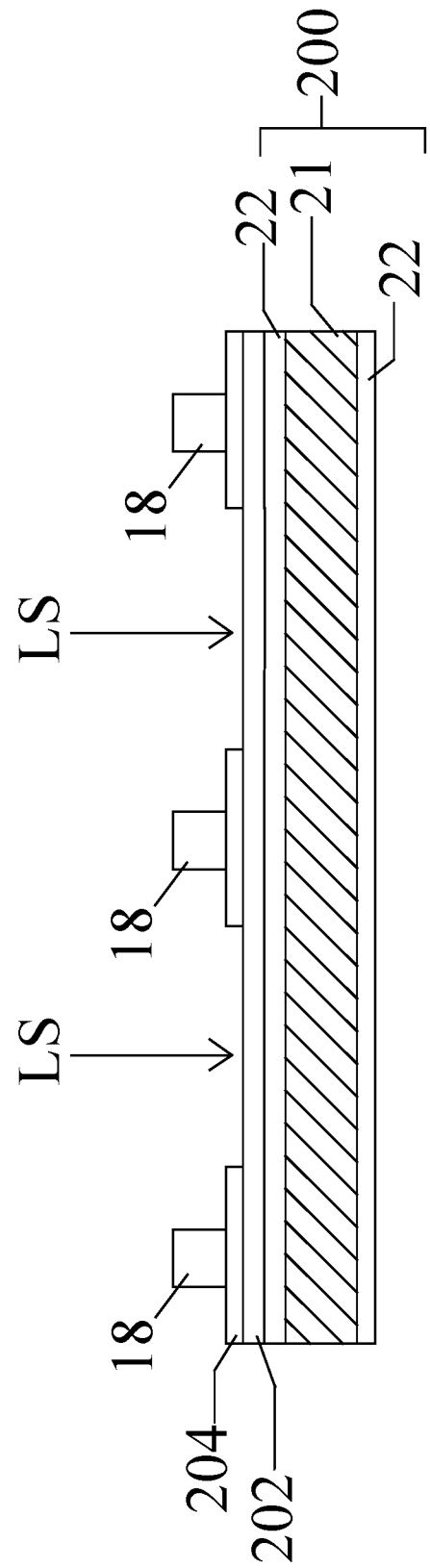
FIG. 5 shows a schematic diagram of the device structure in FIG. 3 when performing a cutting process.
Figure 6:
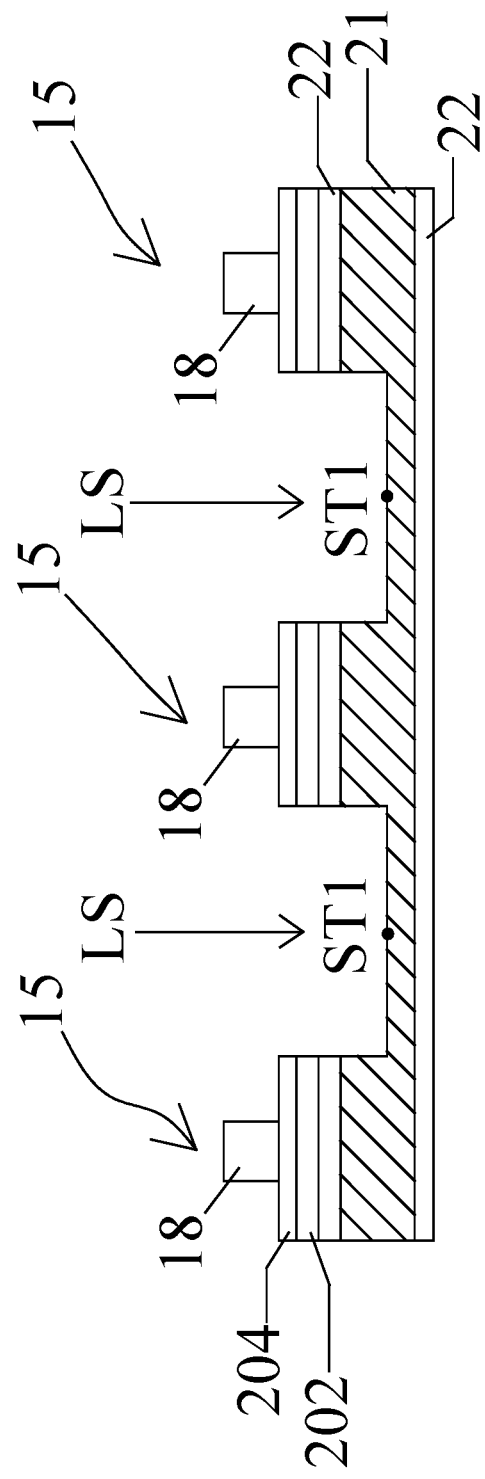
FIG. 6 shows a schematic diagram of the device structure in FIG. 5 after the cutting process is complete.

Specifically, please refer to FIG. 5 and FIG. 6, in which the cutting process LS performs dividing according to the number of the plurality of the electrode unit 18. The cutting process LS is applied to the epitaxial layer 204, the connecting metal layer 202 and the magnetic metal composite substrate 200 to form a plurality of epitaxial die 15, such that each epitaxial die 15 corresponds to an electrode unit 18. It should be noticed that the cutting process shown in FIG. 5 and FIG. 6 is referred to the device structure in FIG. 3. Thus, merely three epitaxial dies 15 are demonstrated. Nevertheless, the present invention is not limited thereto. People who are skilled in the art are able to perform dividing according to the number of the electrode units 18 so as to adjust the number of the epitaxial die 15 to be formed based on the actual needs for their final products. According to the present invention, the cutting process LS includes a cutting end point ST1. As shown in FIG. 6, the cutting end point ST1 is configured in the first metal layer 21 of the magnetic metal composite substrate 200. In the embodiment of the present invention, the foregoing cutting process LS for example may be implemented through a laser cutting, in which the wavelength of the laser can be, for example, 355 nm to 532 nm, preferably 375 nm, the power supply is 5 watts, the frequency is 50 KHz, and the scanning rate is 100 cm/s. The laser cutting process is performed at scanning of 50 times, and the cutting depth is 30 to 50 microns. In addition, the cutting process LS in step S141 of the present invention can further be implemented through a pico-second laser or a femto-second laser. Compared to a traditional laser cutting, the cutting accuracy and precision of using pico-second lasers or femto-second lasers are higher than those of using traditional cutting techniques. Applying pico-second lasers or femto-second lasers helps to maintain a much more complete and sufficient area of epitaxial layer when forming epitaxial crystal dies, which is one major advantage of the present invention using pico-second laser or femto-second laser to perform cutting process.

Figure 7:
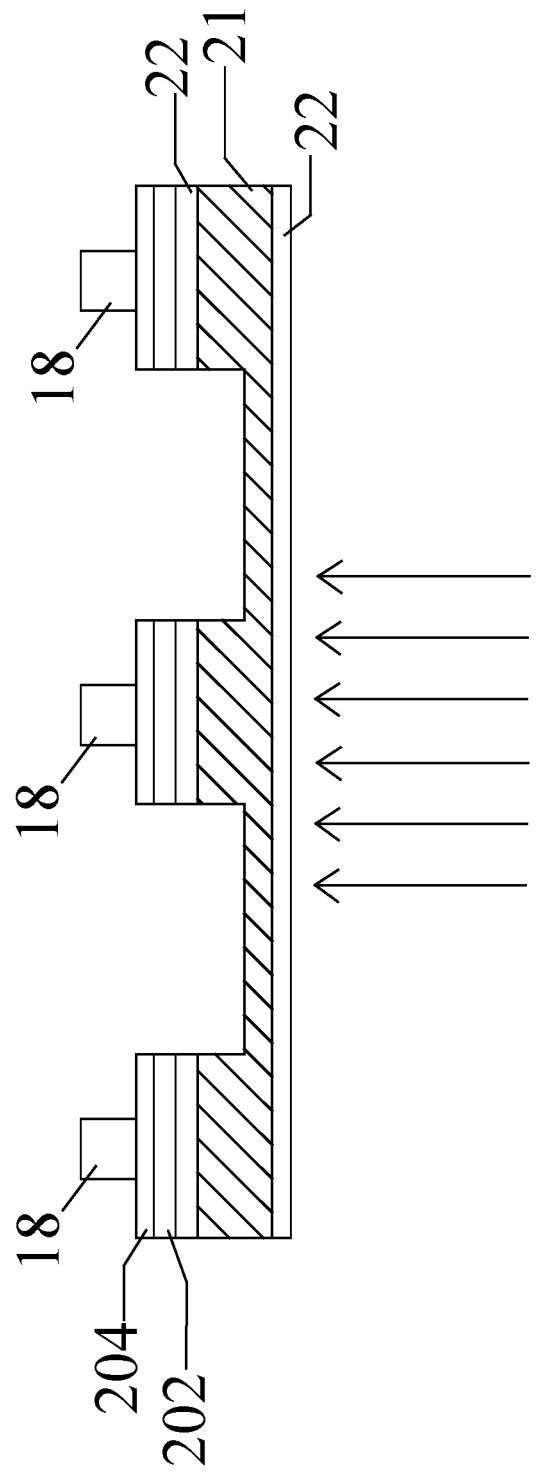
FIG. 7 shows a schematic diagram of the device structure in FIG. 6 when performing an etching process.
Figure 8:
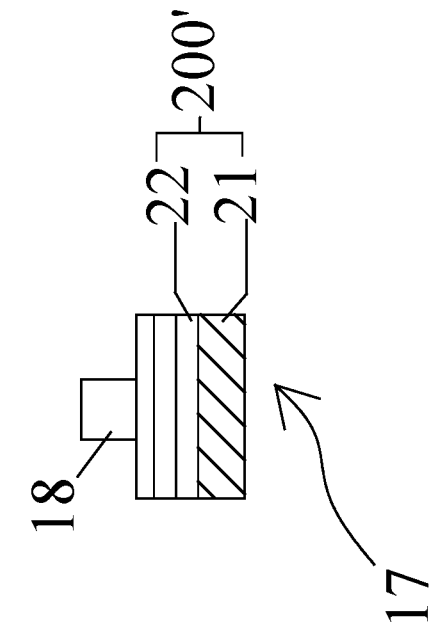
FIG. 8 shows a schematic diagram of the device structure in FIG. 7 after the etching process is complete.
Figure 8:
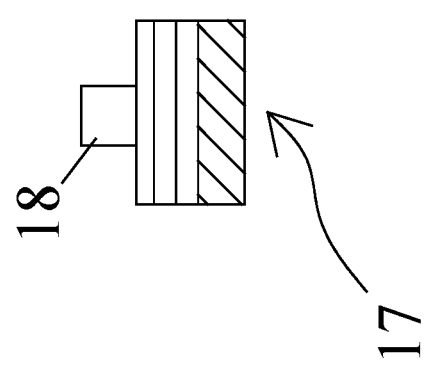
Figure 8:
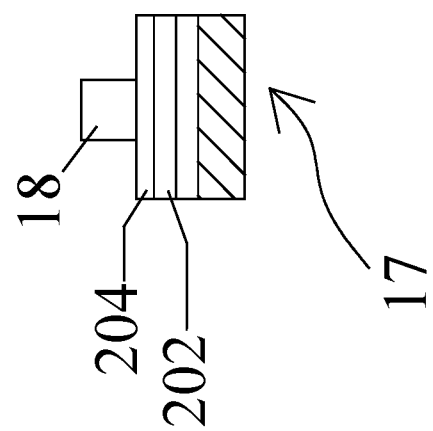

Then, with referring to the step S143, an etching process EH is performed (shown in FIG. 7). As illustrated, the etching process EH removes the second metal layer 22, which is located on the lower surface of the first metal layer 21, and part of the first metal layer 21 so as to form the magnetic light-emitting element 17, each corresponding to one epitaxial die as shown in FIG. 8. Therefore, it is apparent that the magnetic light-emitting element 17 formed through the fabrication method disclosed by the present invention comprises the electrode unit 18, the epitaxial layer 204, the connecting metal layer 202 and a thinner magnetic metal composite substrate 200'. Such magnetic metal composite substrate 200' only includes a second metal layers 22 which is disposed on an upper surface of the first metal layer 21, and a thinner first metal layer 21. As such, by employing the novel fabrication method and etching process, the present invention modifies the conventional substrate structure to make it have better soft magnetic properties and initial magnetic permeability. Meanwhile, the magnetic light-emitting element 17 formed in the present invention is applicable to micro application levels, having its size less than 100 μm and able to meet the current trend requirements for miniaturization of light-emitting components in the industry.

As a result, when the magnetic light-emitting element 17 is employed with wire bonding and packaging to form a vertical type light emitting diode die, such vertical type light emitting diode die is able to have great initial magnetic permeability. Moreover, due to the initial magnetic permeability of this novel and thinner magnetic metal composite substrate 200', the magnetic metal composite substrate 200' achieves to generate a micro current and transmit the micro current to the epitaxial layer 204. As a result, after the vertical type light emitting diode die formed by the present invention is assembled into a diode module, it is functional for not only wireless electricity generation, but also new applications of wireless light emission, whereby fully meet the practical requirements of high-power light emitting diodes nowadays.

According to the embodiment of the present invention, the etching process EH can be implemented through a wet chemical etching process, in which the etching solution can be, for example, a ferric chloride solution, a mixture of nitric acid ($HNO_3$) and hydrogen peroxide ($H_2O_2$), or a mixture of sulfuric acid ($H_2SO_4$) and hydrogen peroxide ($H_2O_2$), where the ratio of nitric acid to hydrogen peroxide for example, can be 3:1, and the ratio of sulfuric acid to hydrogen peroxide can be 4:1. In the embodiment, the etching time for the wet chemical etching process is 10 minutes. And an etching rate of the wet chemical etching process, regarding the copper layer (i.e. the second metal layer 22), is 1.0 micrometers per minute, while the etching rate of the wet chemical etching process, regarding the nickel-iron alloy layer (i.e. the first metal layer 21), is 0.1 to 0.5 micrometers per minute. The present invention is aimed to use the etching process EH (step S143) to form the thinner magnetic metal composite substrate 200', which accordingly has excellent soft magnetic properties and initial magnetic permeability.

And furthermore, in another aspect, due to the magnetic force difference between the epitaxial layer and the nickel-iron alloy layer, the present invention effectively employs the magnetic force difference between the upper and lower layers of the magnetic metal composite substrate, such that each final crystal die is able to perform automatic reversal even when it was in a wrong direction in the first place. In this case, the nickel-iron alloy layer can always automatically turn down, so the alignment of the die distribution position will be accurate. Through such design manners, the present invention successfully solves the conventional problems of excessively high operating time, manpower, and production cost that must had be used for the traditional flip-chip bonding process before. And thus, an optimal design of the present invention is accomplished.

Moreover, since the magnetic metal composite substrate disclosed in the present invention can use itself as a magnetic conductive structure, due to its own soft magnetic properties, when this magnetic force is used to mass transfer to the printed circuit board (PCB) along with the above mentioned die-automatic reversal effect, the luminous intensity of each die can be individually controlled by grounding its upper electrode and controlling the voltage level of the circuit board via an integrated circuit integrated (IC) chip. In addition, when it comes to further integration onto a display panel, the purposes of controlling the partitioned light of the display panel or controlling its different luminous intensities can both be achieved, whereby greatly improve the competitiveness of its industrial developments in the future.

Figure 9:
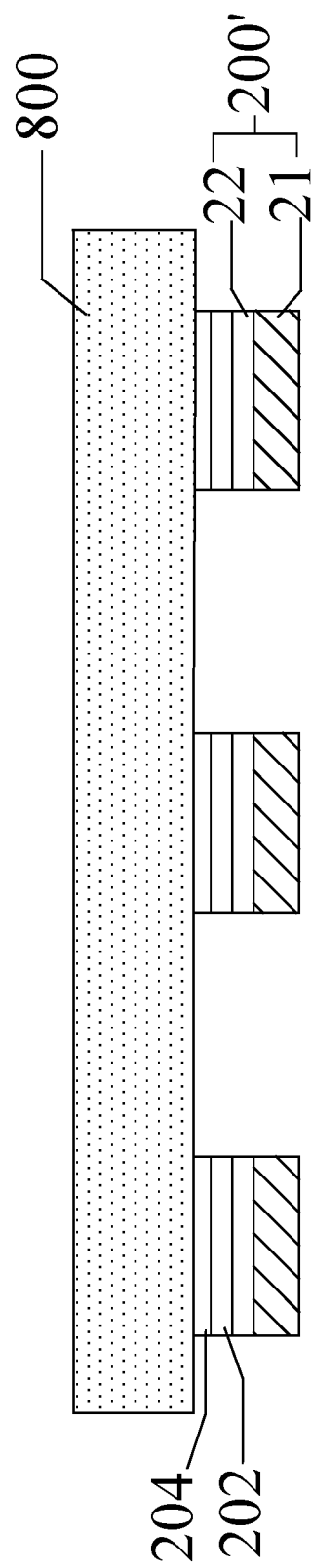
FIG. 9 shows a schematic diagram of the magnetic light-emitting element which is further connected to an adhesive material layer in accordance with the embodiment of the present invention.

FIG. 9 shows a schematic diagram of the magnetic light-emitting element which is further connected to an adhesive material layer in accordance with the embodiment of the present invention. As shown in FIG. 9, the magnetic light-emitting element fabricated in the present invention can be employed with wire bonding and packaging to form a vertical type light emitting diode die, and the epitaxial layer 204 can be adhesively connected to an adhesive material layer 800. According to the embodiment of the present invention, the adhesive material layer 800 can be, for example, a blue tape or a UV tape. In specific, the blue tape and the UV tape can be specially applied to protect the front surface of the wafer during grinding or cutting processes and shipping the wafers. In grinding process, the tapes protect the front surface of the wafer from being damaged and absorb the impact force therein, so as to ensure that the wafer will not crack. Furthermore, when dicing the wafer, using the blue tape or the UV tape also helps to fix the die stably on the tape without causing die loss, and thus improve the cutting quality as well as the convenience of grabbing the die. At the same time, for a variety of working objects or wafer types, various tapes having different stickiness and yet no adhesive residue can also be adopted.

Figure 10:
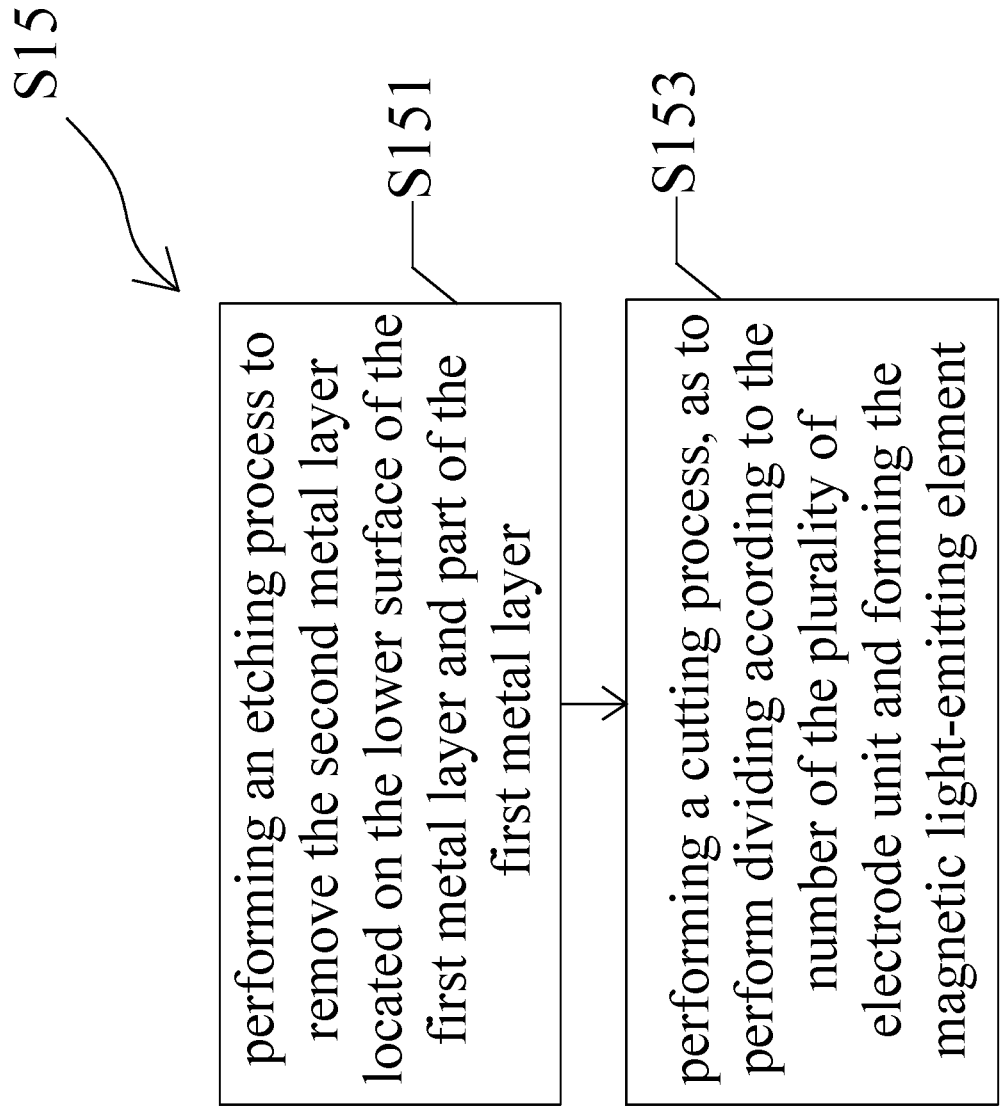
FIG. 10 shows a flow chart of performing the step S15 according to another embodiment of the present invention.

On the other hand, please refer to FIG. 10, which shows a flow chart of performing the step S15 according to another embodiment of the present invention. As illustrated, in another embodiment of the present invention, the step S15 may alternatively comprise performing (1) the step S151, and then (2) the step S153. The step S151 comprises performing an etching process. Please refer to the device structure in FIG. 3 at the same time. The etching process removes the second metal layer 22, which is located on the lower surface of the first metal layer 21, and part of the first metal layer 21. Afterwards, the step S153 is performed, which comprises a cutting process as to perform dividing according to the number of the plurality of the electrode unit 18 such that a plurality of epitaxial die is formed. Each epitaxial die corresponds to an electrode unit, and accordingly the magnetic light-emitting element is manufactured.

Figure 11:
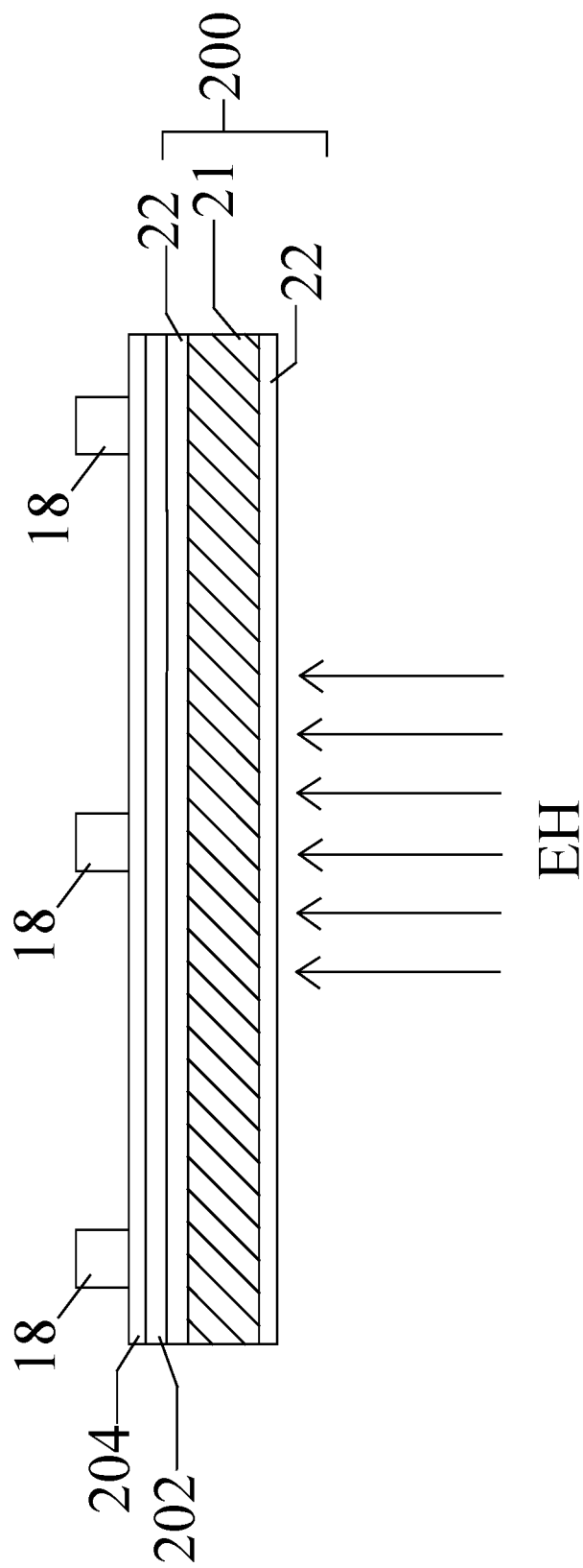
FIG. 11 shows a schematic diagram of the device structure in FIG. 3 when performing an etching process.
Figure 12:
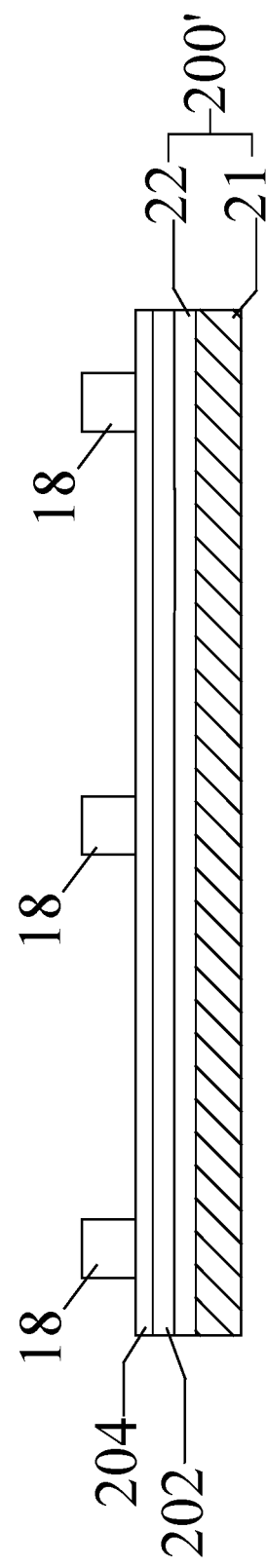
FIG. 12 shows a schematic diagram of the device structure in FIG. 11 after the etching process is complete.

Specifically, please refer to FIG. 11 and FIG. 12. After the device structure in FIG. 3 is provided (including the magnetic metal composite substrate 200, the connecting metal layer 202, the epitaxial layer 204 and the electrode units 18), the present invention continues to execute the complex process as shown in the step S15. And yet, in such embodiment, the complex process comprises performing the step S151 first, and then performing the step S153. As referring to FIG. 11, the etching process EH is performed to remove the second metal layer 22, which is located on the lower surface of the first metal layer 21, and part of the first metal layer 21 of the magnetic metal composite substrate 200. After the etching process EH in step S151 is done, the device structure is shown as in FIG. 12. As described earlier, the present invention successfully employs such an etching process EH to form a thinner magnetic metal composite substrate 200', which is effectively characterized by excellent soft magnetic properties and initial magnetic permeability.

Among them, the etching solution and solution ratio, etching time and other parameters of the etching process EH are as described in the previous embodiment of the invention, so the same descriptions are not to be repeated here again.

Figure 13:
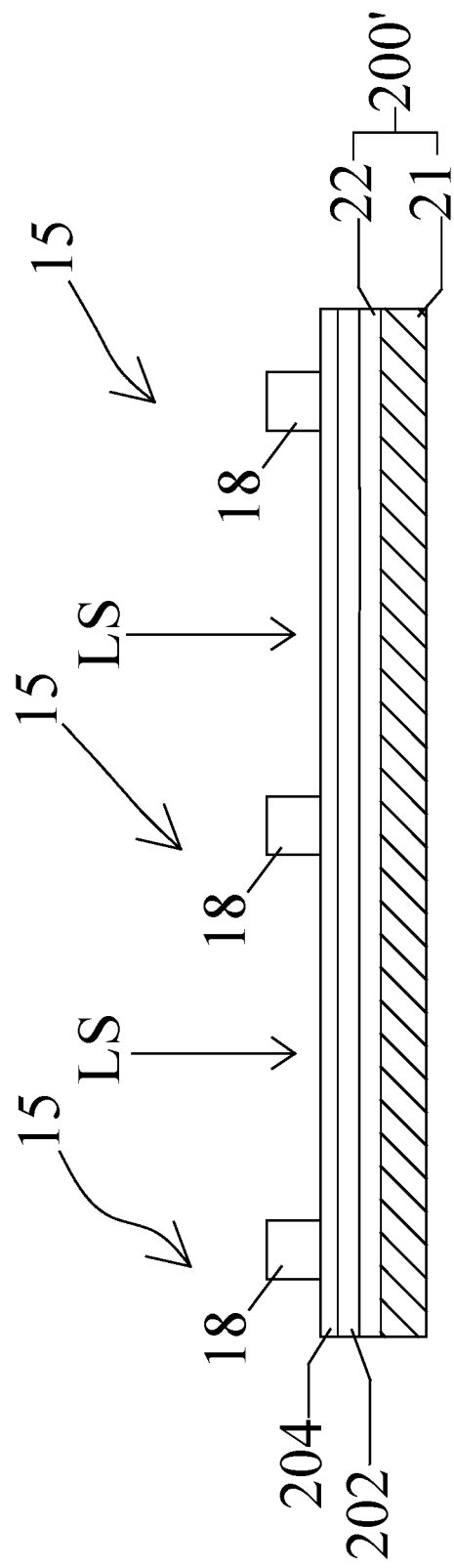
FIG. 13 shows a schematic diagram of the device structure in FIG. 12 when performing a cutting process.
Figure 14:
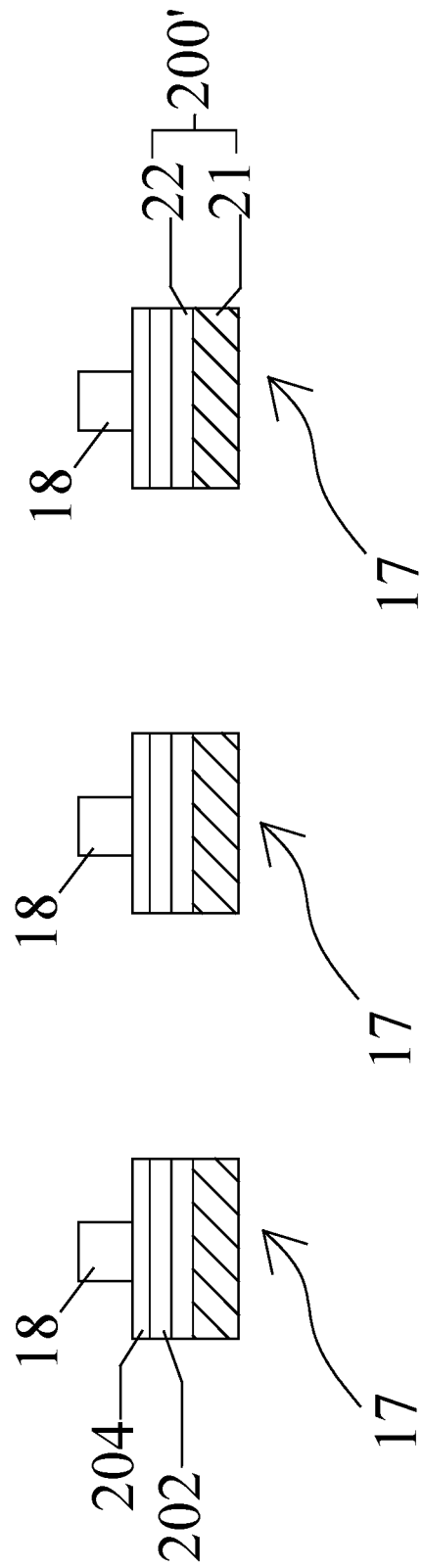
FIG. 14 shows a schematic diagram of the device structure in FIG. 13 after the cutting process is complete.

Next, as shown in FIG. 13, the cutting process LS in step S153 is subsequently performed. The cutting process LS performs dividing according to the number of the plurality of the electrode unit 18, and the cutting process LS is applied to the epitaxial layer 204, the connecting metal layer 202, the second metal layer 22 on an upper surface of the first metal layer 21 and the remaining first metal layer 21 so as to form a plurality of epitaxial die 15. As such, each epitaxial die 15 corresponds to an electrode unit 18. Afterwards, when the cutting process LS is complete, please refer to FIG. 14, the magnetic light-emitting elements 17, each corresponding to one epitaxial die 15 are fabricated by the present invention.

According to the embodiment of the present invention, the cutting process LS to be applied can be a laser cutting, for instance using the foregoing pico-second laser or femto-second laser techniques. The detailed process conditions, wavelength of the laser light, applied power, and other parameters of the cutting process LS are also as described in the previous embodiment of the invention, so the present invention spares the same descriptions.

Therefore, to sum up, based on a variety of embodiments and technical solutions disclosed by the present invention, people who are skilled in the art are allowed to adjust and make modifications according to their actual production needs without departing from the spirits of the invention, and yet still fall within the scope of the present invention. The several illustrative examples of the present invention illustrated in the earlier paragraphs are intended to explain the main technical features of the present invention so that those skilled in the art are able to understand and implement accordingly. Nevertheless, the present invention is definitely not limited thereto.

Figure 15:
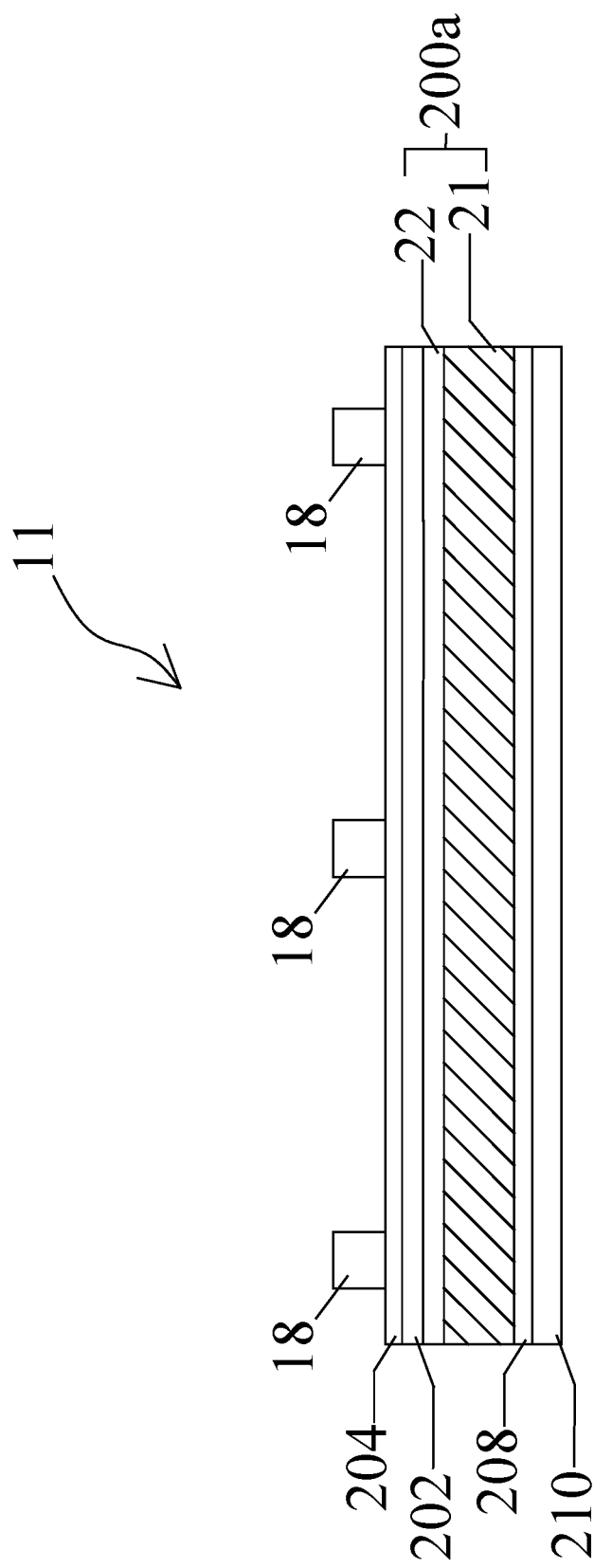
FIG. 15 shows a schematic diagram of a magnetic light-emitting structure in accordance with one embodiment of the present invention.

In a further aspect, please refer to FIG. 15, which shows a schematic diagram of a magnetic light-emitting structure in accordance with one embodiment of the present invention. As shown, the magnetic light-emitting structure 11 comprises a magnetic metal composite substrate 200a, a connecting metal layer 202, an epitaxial layer 204, a plurality of electrode unit 18, a titanium layer 208 and a gold layer 210. The magnetic metal composite substrate 200a only includes a first metal layer 21 and a second metal layer 22 which is disposed on an upper surface of the first metal layer 21. According to the embodiment of the present invention, the material of the first metal layer 21 is a nickel-iron alloy, and the alloy may be, for example, a nickel-iron alloy having a nickel content of 36%. The material of the second metal layer 22 is copper.

The connecting metal layer 202 is disposed on the magnetic metal composite substrate 200a, and the epitaxial layer 204 is further disposed on the connecting metal layer 202. The plurality of electrode units 18 are disposed on a top surface of the epitaxial layer 204. The titanium layer 208 is disposed on a lower surface of the first metal layer 21. The gold layer 210 is disposed on a lower surface of the titanium layer 208. In such an embodiment, a thickness of the titanium layer 208, for example, can be 0.5 µm. And, a thickness of the gold layer 210 can be 1.0 µm. According to the embodiment of the present invention, the above mentioned cutting process LS and etching process EH may also be applied to the magnetic light-emitting structure 11 so as to form a plurality of magnetic light-emitting element. What differs from the foregoing embodiments is that, the magnetic light-emitting element fabricated herein further comprises a titanium layer 208 and a gold layer 210, which are configured on a lower surface of the first metal layer 21 (nickel-iron alloy layer).

Therefore, to sum above, it is apparent that, the present invention proposes a novel magnetic light-emitting structure and a fabrication method for manufacturing a magnetic light-emitting, which modifies the original grain substrate structure and materials to have better soft magnetic properties and initial magnetic permeability. As a result, the light-emitting diode die itself can be taken as a magnetic conductive structure. As long as it is assembled with a magnetic device, such as a tiny magnetic probe, by employing the mechanism of magnetic array absorption, a great number of vertical light-emitting diode die structure having such soft magnetic properties can be absorbed at one time to achieve rapid and mass-transfer efficiency. It also meets the requirements of the current Micro LED technology for rapid mass transfer, effectively enhancing its industrial production competitiveness.

Meanwhile, another major objective of the present invention is to provide a spontaneous automatic reversal effect due to a certain magnetic force difference between the upper layer (i.e. the epitaxial layer) and the lower layer (i.e. the nickel-iron alloy layer) of the magnetic light-emitting element. Such a magnetic force difference enables each final crystal die to be able to perform automatic reversal even when it was in a wrong direction in the first place. In this case, the nickel-iron alloy layer can always automatically turn down and in a lower position of the structure, such that the optimal result of automatic alignment and positioning can be accomplished. And the rapid mass transfer in the related industry is also achieved. As a result, the Applicants assert that the present invention is instinct, effective and highly competitive for incoming technologies, industries and researches developed in the future. It is obvious that the technical features, means and effects achieved by the present invention are significantly different from the current solutions, and can not be accomplished easily by those who are familiar with the industry. As a result, it is believed that the present invention is indeed characterized by patentability and shall be patentable soon in a near future.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A fabrication method for manufacturing a magnetic light-emitting element, comprising:
   providing a magnetic metal composite substrate, comprising a first metal layer and two second metal layers, wherein each of the second metal layers is respectively disposed on an upper surface and a lower surface of the first metal layer;

forming a connecting metal layer on the magnetic metal composite substrate and an epitaxial layer on the connecting metal layer;
providing a plurality of electrode unit on a top surface of the epitaxial layer; and
performing a complex process, which comprises removing the second metal layer which is located on the lower surface of the first metal layer and part of the first metal layer as well as performing cutting according to the number of the plurality of electrode unit, so as to form a plurality of epitaxial die, wherein each the epitaxial die corresponds to each the electrode unit to form the magnetic light-emitting element according to each the epitaxial die.

2. The fabrication method for manufacturing a magnetic light-emitting element of claim 1, wherein the magnetic light-emitting element is employed with wire bonding and packaging to form a vertical type light emitting diode die, and the vertical type light emitting diode die is able to have an initial magnetic permeability.

3. The fabrication method for manufacturing a magnetic light-emitting element of claim 2, wherein the magnetic metal composite substrate generates a micro current and transmits the micro current to the epitaxial layer due to the initial magnetic permeability.

4. The fabrication method for manufacturing a magnetic light-emitting element of claim 2, wherein the first metal layer and the second metal layer are combined through cutting, vacuum heating, and grinding or polishing to form the magnetic metal composite substrate, such that the magnetic metal composite substrate has a high thermal conductivity, low thermal expansion coefficient and the initial magnetic permeability.

5. The fabrication method for manufacturing a magnetic light-emitting element of claim 1, wherein a thickness proportion of the second metal layer to the first metal layer to the second metal layer in the magnetic metal composite substrate ranges from 1:3:1 to 1:9:1.

6. The fabrication method for manufacturing a magnetic light-emitting element of claim 1, wherein a material of the first metal layer in the magnetic metal composite substrate is nickel-iron alloy.

7. The fabrication method for manufacturing a magnetic light-emitting element of claim 1, wherein a material of the second metal layer in the magnetic metal composite substrate is copper.

8. The fabrication method for manufacturing a magnetic light-emitting element of claim 1, wherein the complex process comprises:
performing a cutting process, in which the cutting process performs dividing according to the number of the plurality of electrode unit, the cutting process is applied to the epitaxial layer, the connecting metal layer and the magnetic metal composite substrate to form the plurality of epitaxial die, such that each the epitaxial die corresponds to each the electrode unit, the cutting process includes a cutting end point, and the cutting end point is configured in the first metal layer of the magnetic metal composite substrate; and
performing an etching process, which removes the second metal layer which is located on the lower surface of the first metal layer and part of the first metal layer, such that the magnetic light-emitting element is formed according to each the epitaxial die.

9. The fabrication method for manufacturing a magnetic light-emitting element of claim 8, wherein the cutting process is implemented through a laser cutting.

10. The fabrication method for manufacturing a magnetic light-emitting element of claim 9, wherein a laser wavelength of the laser cutting is 355 nm to 532 nm, and a cutting depth is 30 microns to 50 microns.

11. The fabrication method for manufacturing a magnetic light-emitting element of claim 8, wherein the etching process is implemented through a wet chemical etching process.

12. The fabrication method for manufacturing a magnetic light-emitting element of claim 11, wherein an etching time for the wet chemical etching process is 10 minutes, and an etching solution is a ferric chloride solution, a mixture of nitric acid ($HNO_3$) and hydrogen peroxide ($H_2O_2$), or a mixture of sulfuric acid ($H_2SO_4$) and hydrogen peroxide ($H_2O_2$).

13. The fabrication method for manufacturing a magnetic light-emitting element of claim 1, wherein the complex process comprises:
performing an etching process, which removes the second metal layer which is located on the lower surface of the first metal layer and part of the first metal layer; and
performing a cutting process, in which the cutting process performs dividing according to the number of the plurality of electrode unit, the cutting process is applied to the epitaxial layer, the connecting metal layer, the second metal layer which is located on the upper surface of the first metal layer and the remaining first metal layer to form the plurality of epitaxial die, such that each the epitaxial die corresponds to each the electrode unit, and the magnetic light-emitting element is formed according to each the epitaxial die.

14. The fabrication method for manufacturing a magnetic light-emitting element of claim 13, wherein the cutting process is implemented through a laser cutting.

15. The fabrication method for manufacturing a magnetic light-emitting element of claim 14, wherein a laser wavelength of the laser cutting is 355 nm to 532 nm, and a cutting depth is 30 microns to 50 microns.

16. The fabrication method for manufacturing a magnetic light-emitting element of claim 13, wherein the etching process is implemented through a wet chemical etching process.

17. The fabrication method for manufacturing a magnetic light-emitting element of claim 16, wherein an etching time for the wet chemical etching process is 10 minutes, and an etching solution is a ferric chloride solution, a mixture of nitric acid ($HNO_3$) and hydrogen peroxide ($H_2O_2$), or a mixture of sulfuric acid ($H_2SO_4$) and hydrogen peroxide ($H_2O_2$).

* * * * *